(12) United States Patent
Liu et al.

(10) Patent No.: US 12,519,434 B2
(45) Date of Patent: Jan. 6, 2026

(54) LOW-PHASE-SHIFT VARIABLE-GAIN AMPLIFIER AND METHOD FOR PROCESSING RADIO FREQUENCY SIGNAL

(71) Applicant: SANECHIPS TECHNOLOGY CO., LTD, Shenzhen (CN)

(72) Inventors: Yi Liu, Shenzhen (CN); Yong Wang, Shenzhen (CN)

(73) Assignee: SANECHIPS TECHNOLOGY CO., LTD, Shenzhen (CN)

( * ) Notice: Subject to any disclaimer, the term of this patent is extended or adjusted under 35 U.S.C. 154(b) by 11 days.

(21) Appl. No.: 18/694,227

(22) PCT Filed: Mar. 19, 2022

(86) PCT No.: PCT/CN2022/081854
§ 371 (c)(1),
(2) Date: Mar. 21, 2024

(87) PCT Pub. No.: WO2023/045283
PCT Pub. Date: Mar. 30, 2023

(65) Prior Publication Data
US 2024/0322772 A1  Sep. 26, 2024

(30) Foreign Application Priority Data

Sep. 22, 2021 (CN) .......................... 202111108311.6

(51) Int. Cl.
| H03F 3/45 | (2006.01) |
| H03G 3/30 | (2006.01) |
| H04B 1/04 | (2006.01) |

(52) U.S. Cl.
CPC ....... H03F 3/45076 (2013.01); H03G 3/3036 (2013.01); H03F 2200/451 (2013.01);
(Continued)

(58) Field of Classification Search
CPC ..... H03F 1/02; H03F 1/14; H03F 1/22; H03F 1/56; H03F 3/10; H03F 3/45; H03F 3/60;
(Continued)

(56) References Cited

U.S. PATENT DOCUMENTS

| 11,159,136 B2 * | 10/2021 | Tsai .................. H03G 3/001 |
| 2006/0071712 A1 * | 4/2006 | Lee .................. H03G 1/0088 330/254 |

(Continued)

FOREIGN PATENT DOCUMENTS

| CN | 102045028 A | 5/2011 |
| CN | 110311636 A | 10/2019 |

(Continued)

OTHER PUBLICATIONS

International Search Report for corresponding application PCT/CN2022/081854 filed Mar. 19, 2022; Mail date Apr. 27, 2022.

*Primary Examiner* — Shawkat M Ali
(74) *Attorney, Agent, or Firm* — CANTOR COLBURN LLP

(57) ABSTRACT

Provided are a low-phase-shift variable-gain amplifier and a method for processing a radio frequency signal. The low-phase-shift variable-gain amplifier comprises: a differential cascode amplification circuit, which comprises a common-source transistor and a common-gate transistor, wherein a gate stage of the common-source transistor is connected to a first bias voltage via a target resistor, and a gate stage of the common-gate transistor is connected to a second bias voltage; a current-steering structure, wherein one end of the current-steering structure is connected between the common-source transistor and the common-gate transistor, a third current signal outputted by the current-steering structure is used to adjust a gain of the differential cascode amplification circuit; and a phase compensation circuit, (Continued)

wherein one end of the phase compensation circuit is connected between the common-source transistor and the common-gate transistor.

20 Claims, 5 Drawing Sheets

(52) U.S. Cl.
CPC . *H03G 2201/103* (2013.01); *H03G 2201/307* (2013.01); *H04B 1/04* (2013.01); *H04B 2001/045* (2013.01)

(58) Field of Classification Search
CPC ...... H03F 3/193; H03F 3/195; H03F 3/45076; H03G 1/00; H03G 3/30; H03G 3/3036; H04B 1/00; H04B 1/04
USPC ......... 330/51, 252, 254, 277, 285, 292, 311; 375/219, 295–297
See application file for complete search history.

(56) References Cited

U.S. PATENT DOCUMENTS

| | | | | |
|---|---|---|---|---|
| 2014/0292410 | A1* | 10/2014 | Danjo | H03F 3/45192 |
| | | | | 330/253 |
| 2021/0328565 | A1* | 10/2021 | Guan | H03F 1/565 |
| 2022/0021363 | A1* | 1/2022 | Cui | H03G 1/0029 |

FOREIGN PATENT DOCUMENTS

| | | | |
|---|---|---|---|
| CN | 112865799 | A | 5/2021 |
| CN | 113328712 | A | 8/2021 |

* cited by examiner

LOW-PHASE-SHIFT VARIABLE-GAIN AMPLIFIER AND METHOD FOR PROCESSING RADIO FREQUENCY SIGNAL

CROSS-REFERENCE TO RELATED APPLICATION

The present disclosure is a national stage filing under 35 U.S.C. § 371 of international application number PCT/CN2022/081854, filed Mar. 19, 2022, which claims priority to Chinese Patent Application No. 202111108311.6, filed to the China National Intellectual Property Administration on Sep. 22, 2021, these applications are incorporated herein by reference in its entirety.

TECHNICAL FIELD

Embodiments of the present disclosure relate to the technical field of electronic integrated circuits, and in particular, to a low-phase-shift variable-gain amplifier and a method for processing a radio frequency signal.

BACKGROUND

With the development of new generation of communication technology, beam scanning and beam forming have become research hotspots in communication transceiver front ends. A variable-gain amplifier is a key device allowing for a beam to be capable of achieving shape change, and prevents the effect of phase shift on precision of the beam scanning and beam forming by strictly controlling additional phase fluctuation during gain change. Thus, how to reduce phase change caused by gain change of the variable-gain amplifier is a difficulty in circuit design.

From existing research results in the industry, methods for suppressing phase change of the variable-gain amplifier may be collectively referred to as a compensation method. In the related art, a 7-bit digital-control current-steering variable-gain amplifier is provided, in which a single-stage differential cascode structure is used, an inductor is connected in series to reduce phase shift and increase the gain; however, the use of the inductor may lead to an increase in layout area, and in addition, the effect of phase shift elimination is also not ideal. In addition, further provided is a variable-gain amplifier with a two-stage structure; by adding an inverting compensation circuit at an output end of a second-stage amplifier, phase changes of a first-stage amplifier and the second-stage amplifier are complementary during gain change, so that an additional phase shift of the whole circuit is maintained to fluctuate within a small range. Likewise, in another variable-gain amplifier with a two-stage structure, by adding branch circuits having a phase compensation effect to front and rear two stages of amplifiers, phase fluctuation caused by turning on or turning off common-gate amplifiers of different sizes in a current-steering circuit is reduced. The two methods for mutual compensation by using a two-stage structure to reduce the additional phase shift of the variable-gain amplifier are effective, but due to the two-stage cascade structure, design work of inter-stage impedance matching will be additionally increased, and also it will cause increase of layout size and excessive power consumption; furthermore, the additional phase fluctuation during gain change cannot be controlled strictly, so that the phase shift greatly affects the precision of beam scanning and beam forming.

Aiming at the problems in the related art that when the variable-gain amplifier is to solve a large phase change, the layout size corresponding to the determined variable-gain amplifier is too large and the power consumption is high, etc., no effective solution has been proposed.

SUMMARY

Embodiments of the present disclosure provide technical solutions of a low-phase-shift variable-gain amplifier and a method for processing a radio frequency signal, so as to at least solve the problems in the related art that when the variable-gain amplifier is to solve a large phase change, the layout size corresponding to the determined variable-gain amplifier is too large and the power consumption is high, etc.

According to an embodiment of the present disclosure, provided is a low-phase-shift variable-gain amplifier, including: a differential cascode amplification circuit, the differential cascode amplification circuit comprising a common-source transistor and a common-gate transistor, wherein a gate stage of the common-source transistor is connected to a first bias voltage by a target resistor, the first bias voltage is used to control a drain current signal outputted by the common-source transistor to be a first current signal with a fixed amplitude, and a gate stage of the common-gate transistor is connected to a second bias voltage, the second bias voltage is used to control a drain current signal outputted by the common-gate transistor to be a second current signal with a variable amplitude, and the amplitude of the first current signal is greater than or equal to the amplitude of the second current signal; a current-steering structure, wherein one end of the current-steering structure is connected between the common-source transistor and the common-gate transistor, a third current signal outputted by the current-steering structure is used to adjust a gain of the differential cascode amplification circuit, and the gain represents a gain of an output signal of the differential cascode amplification circuit relative to an input signal; and a phase compensation circuit, wherein one end of the phase compensation circuit is connected between the common-source transistor and the common-gate transistor, and a compensation capacitance value of a variable capacitor in the phase compensation circuit is a capacitance value determined according to the third current signal, wherein the variable capacitor is configured to reduce generated phase shift of the second current signal when the third current signal adjusts the gain of the differential cascode amplification circuit.

In an exemplary embodiment, the method further includes: the phase compensation circuit acquires the third current signal outputted by the current-steering structure; the capacitance value of the variable capacitor in the phase compensation circuit is increased when the third current signal increases; and the capacitance value of the variable capacitor in the phase compensation circuit is decreased when the third current signal decreases.

In an exemplary embodiment, the gate stage of the common-source transistor in the differential cascode amplification circuit is connected to an output end of an input impedance matching circuit, and is configured to receive an input signal obtained after bandwidth impedance matching is performed by the input impedance matching circuit, wherein the bandwidth impedance matching is used to instruct to convert a single-ended signal of a radio frequency signal into a differential signal.

In an exemplary embodiment, a drain stage of the common-gate transistor in the differential cascode amplification circuit is connected to an input end of an output impedance matching circuit, and is configured to output, by the output impedance matching circuit, an output signal obtained after processing by the differential cascode amplification circuit.

In an exemplary embodiment, the input impedance matching circuit and the output impedance matching circuit use a four-stage resonance circuit in which capacitors are connected in parallel in transformer structures.

In an exemplary embodiment, the current-steering structure includes N groups of common-gate transistors with different width-to-length ratios, and is configured to determine the outputted third current according to operating states of the common-gate transistors with different width-to-length ratios, wherein N is a positive integer greater than or equal to 4, and the width-to-length ratio is used to indicate a ratio of a gate width to a gate length of a corresponding gate stage of the common-gate transistors forming the current-steering structure.

In an exemplary embodiment, drains of the N groups of common-gate transistors with different width-to-length ratios are connected in series and connected to a target voltage.

In an exemplary embodiment, a gate of each common-gate transistor among the N groups of common-gate transistors with different width-to-length ratios corresponds to one digital signal, wherein the digital signal is used to indicate an operating state of each common-gate transistor among the N groups of common-gate transistors with different width-to-length ratios in the current-steering structure at the same time point.

In an exemplary embodiment, the method further includes: when the value of N is 4, change range of gain attenuation of the differential cascode amplification circuit correspondingly controlled by the current-steering structure is 0 dB-7.5 dB, wherein attenuation step of the gain attenuation is 0.5 dB.

In an exemplary embodiment, the variable capacitor in the phase compensation circuit includes at least one of: an adjustable capacitor and a source-drain shorted transistor.

According to some other embodiments of the present disclosure, further provided is a method for processing a radio frequency signal, including: a differential cascode amplification circuit receives a differential signal obtained after broadband impedance matching and sent by an output end of an input impedance matching circuit; N digital signals are acquired to determine operating states of N groups of common-gate transistors with different width-to-length ratios in a current-steering structure, so as to determine, according to the operating states, a third current signal for adjusting the differential signal; gain is performed on the differential signal according to the third current signal, to obtain an output signal; and the output signal is sent to an input end of an output impedance matching circuit, to output, by an output end of the output impedance matching circuit, a target radio frequency signal processed by a low-phase-shift variable-gain amplifier.

In an exemplary embodiment, after N digital signals are acquired to determine operating states of N groups of common-gate transistors with different width-to-length ratios in a current-steering structure, so as to determine, according to the operating states, a third current signal for adjusting the differential signal, the method further includes: a target capacitance value to be compensated by a phase compensation circuit is determined according to the magnitude of the third current signal; and the target capacitance value is used to perform phase compensation on the differential cascode amplification circuit, so as to reduce generated phase shift of a second current signal.

By means of the present disclosure, provided are a differential cascode amplification circuit, the differential cascode amplification circuit comprising a common-source transistor and a common-gate transistor, wherein a gate stage of the common-source transistor is connected to a first bias voltage by a target resistor, the first bias voltage is used to control a drain current signal outputted by the common-source transistor to be a first current signal with a fixed amplitude, and a gate stage of the common-gate transistor is connected to a second bias voltage, the second bias voltage is used to control a drain current signal outputted by the common-gate transistor to be a second current signal with a variable amplitude, and the amplitude of the first current signal is greater than or equal to the amplitude of the second current signal; a current-steering structure, wherein one end of the current-steering structure is connected between the common-source transistor and the common-gate transistor, a third current signal outputted by the current-steering structure is used to adjust a gain of the differential cascode amplification circuit, and the gain represents a gain of an output signal of the differential cascode amplification circuit relative to an input signal; and a phase compensation circuit, wherein one end of the phase compensation circuit is connected between the common-source transistor and the common-gate transistor, and a compensation capacitance value of a variable capacitor in the phase compensation circuit is a capacitance value determined according to the third current signal, wherein the variable capacitor is configured to reduce generated phase shift of the second current signal when the third current signal adjusts the gain of the differential cascode amplification circuit. That is to say, an adjustable capacitor is introduced into the variable-gain amplification circuit as the phase compensation circuit, phase shift fluctuation of the amplification circuit during switching between different gain states is significantly reduced, and the problem of large phase change of a traditional current-steering variable-gain amplifier is overcome; furthermore, the differential cascode structure has advantages of simple circuit structure design, small module layout area and low power consumption, which reduces the occurrence of additional increase of design work of inter-stage impedance matching, and increase of layout size and excessive power consumption. The technical solutions above are used to solve the problems in the related art that when the variable-gain amplifier is to solve a large phase change, the layout size corresponding to the determined variable-gain amplifier is too large and the power consumption is high, etc.

DETAILED DESCRIPTION OF THE EMBODIMENTS

Hereinafter, embodiments of the present disclosure are described in detail with reference to the accompanying drawings and in conjunction with the embodiments.

It is to be noted that the terms "first", "second", etc. in the description, claims and drawings of the present disclosure are used to distinguish similar objects, and are not necessarily used to describe a specific sequence or a precedence order.

Figure 1:
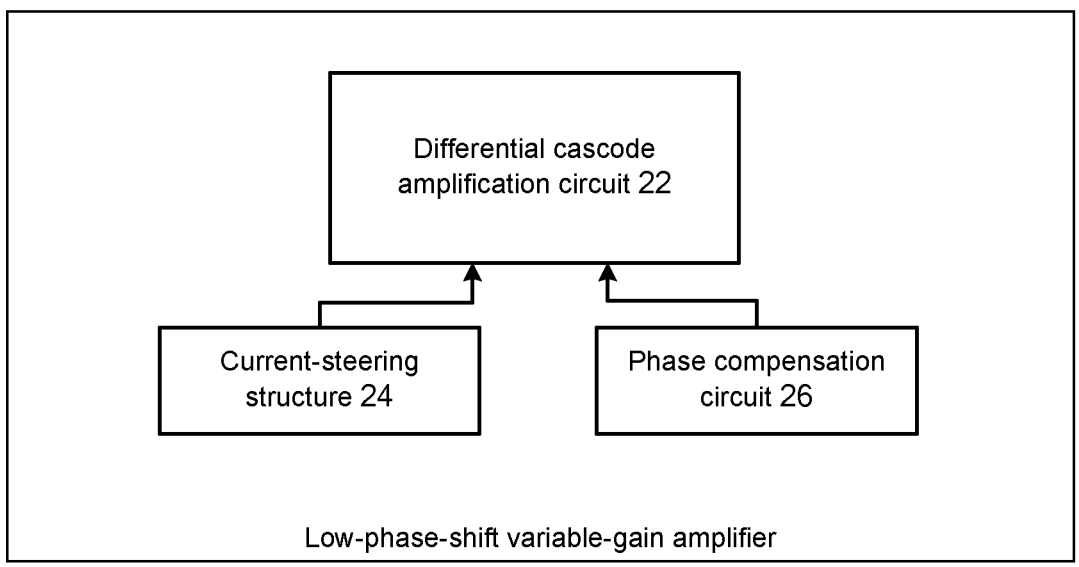
FIG. 1 is a schematic structural diagram of a low-phase-shift variable-gain amplifier according to embodiments of the present disclosure.

The present embodiment provides a low-phase-shift variable-gain amplifier running on a chip. FIG. 1 is a schematic structural diagram of a low-phase-shift variable-gain amplifier according to embodiments of the present disclosure. As shown in FIG. 1, the low-phase-shift variable-gain amplifier includes the following circuits:

- a differential cascode amplification circuit 22, the differential cascode amplification circuit comprising a common-source transistor and a common-gate transistor, wherein a gate stage of the common-source transistor is connected to a first bias voltage by a target resistor, the first bias voltage is used to control a drain current signal outputted by the common-source transistor to be a first current signal with a fixed amplitude, and a gate stage of the common-gate transistor is connected to a second bias voltage, the second bias voltage is used to control a drain current signal outputted by the common-gate transistor to be a second current signal with a variable amplitude, and the amplitude of the first current signal is greater than or equal to the amplitude of the second current signal;
- a current-steering structure 24, wherein one end of the current-steering structure is connected between the common-source transistor and the common-gate transistor, a third current signal outputted by the current-steering structure is used to adjust a gain of the differential cascode amplification circuit, and the gain represents a gain of an output signal of the differential cascode amplification circuit relative to an input signal; and
- a phase compensation circuit 26, wherein one end of the phase compensation circuit is connected between the common-source transistor and the common-gate transistor, and a compensation capacitance value of a variable capacitor in the phase compensation circuit is a capacitance value determined according to the third current signal, wherein the variable capacitor is configured to reduce generated phase shift of the second current signal when the third current signal adjusts the gain of the differential cascode amplification circuit.

By the described structure, provided are a differential cascode amplification circuit, the differential cascode amplification circuit comprising a common-source transistor and a common-gate transistor, wherein a gate stage of the common-source transistor is connected to a first bias voltage by a target resistor, the first bias voltage is used to control a drain current signal outputted by the common-source transistor to be a first current signal with a fixed amplitude, and a gate stage of the common-gate transistor is connected to a second bias voltage, the second bias voltage is used to control a drain current signal outputted by the common-gate transistor to be a second current signal with a variable amplitude, and the amplitude of the first current signal is greater than or equal to the amplitude of the second current signal; a current-steering structure, wherein one end of the current-steering structure is connected between the common-source transistor and the common-gate transistor, a third current signal outputted by the current-steering structure is used to adjust a gain of the differential cascode amplification circuit, and the gain represents a gain of an output signal of the differential cascode amplification circuit relative to an input signal; and a phase compensation circuit, wherein one end of the phase compensation circuit is connected between the common-source transistor and the common-gate transistor, and a compensation capacitance value of a variable capacitor in the phase compensation circuit is a capacitance value determined according to the third current signal, wherein the variable capacitor is configured to reduce generated phase shift of the second current signal when the third current signal adjusts the gain of the differential cascode amplification circuit. That is to say, an adjustable capacitor is introduced into the variable-gain amplification circuit as the phase compensation circuit, phase shift fluctuation of the amplification circuit during switching between different gain states is significantly reduced, and the problem of large phase change of a traditional current-steering variable-gain amplifier is overcome; furthermore, the differential cascode structure has advantages of simple circuit structure design, small module layout area and low power consumption, which reduces the occurrence of additional increase of design work of inter-stage impedance matching, and increase of layout size and excessive power consumption. The technical solutions above are used to solve the problems in the related art that when the variable-gain amplifier is to solve a large phase change, the layout size corresponding to the determined variable-gain amplifier is too large and the power consumption is high, etc.

In an exemplary embodiment, the phase compensation circuit acquires the third current signal outputted by the current-steering structure; the capacitance value of the variable capacitor in the phase compensation circuit is increased when the third current signal increases; and the capacitance value of the variable capacitor in the phase compensation circuit is decreased when the third current signal decreases.

In an exemplary embodiment, the gate stage of the common-source transistor in the differential cascode amplification circuit is connected to an output end of an input impedance matching circuit, and is configured to receive an input signal obtained after bandwidth impedance matching is performed by the input impedance matching circuit, wherein the bandwidth impedance matching is used to instruct to convert a single-ended signal of a radio frequency signal into a differential signal.

In an exemplary embodiment, a drain stage of the common-gate transistor in the differential cascode amplification circuit is connected to an input end of an output impedance matching circuit, and is configured to output, by the output impedance matching circuit, an output signal obtained after processing by the differential cascode amplification circuit.

In an exemplary embodiment, the input impedance matching circuit and the output impedance matching circuit use a four-stage resonance circuit in which capacitors are connected in parallel in transformer structures.

In an exemplary embodiment, the current-steering structure includes N groups of common-gate transistors with different width-to-length ratios, and is configured to determine the outputted third current according to operating states of the common-gate transistors with different width-to-length ratios, wherein N is a positive integer greater than or equal to 4, and the width-to-length ratio is used to indicate a ratio of a gate width to a gate length of a corresponding gate stage of the common-gate transistors forming the current-steering structure.

In an exemplary embodiment, drains of the N groups of common-gate transistors with different width-to-length ratios are connected in series and connected to a target voltage.

In an exemplary embodiment, a gate of each common-gate transistor among the N groups of common-gate transistors with different width-to-length ratios corresponds to one digital signal, wherein the digital signal is used to indicate an operating state of each common-gate transistor among the N groups of common-gate transistors with different width-to-length ratios in the current-steering structure at the same time point.

It should be noted that, the N groups of transistors with different width-to-length ratios are transistors of the same type, but it is merely that the width-to-length ratios corresponding to the transistors are increased in integral multiples. Optionally, for example, when the N groups of transistors are based on 1×, the width-to-length ratio of second group of transistors is twice that of first group of transistors, and the width-to-length ratio of third group of transistors is three times that of the first group of transistors; and when the N groups of transistors are based on 2×, the width-to-length ratio of the second group of transistors is twice that of the first group of transistors, and the width-to-length ratio of the third group of transistors is four times that of the first group of transistors, and so on, which will not be limited in the present disclosure.

In an exemplary embodiment, when the value of N is 4, change range of gain attenuation of the differential cascode amplification circuit correspondingly controlled by the current-steering structure is 0 dB-7.5 dB, wherein attenuation step of the gain attenuation is 0.5 dB.

As an optional embodiment, when the value of N is 4, a control signal of the current-steering structure corresponding to the differential cascode amplification circuit is a 4-bit control level; transistors with different width-to-length ratios in the current-steering structure are turned on or turned off by changing values of 0 and 1. When the 4-bit control level is 0000, transistors with the same type and corresponding to four different width-to-length ratios are all turned off, and at this time, the gain of the differential cascode amplification circuit is 7.5 dB at maximum. When the 4-bit control level is 1111, transistors of the same type and corresponding to four different width-to-length ratios are all turned on, and at this time, the gain of the differential cascode amplification circuit is 0 dB at minimum. And then by change of bits from 0000 to 1111, the total gain change amount achieved by control bits is 7.5 dB, and the change of each bit corresponds to an attenuation step bit of 0.5 dB.

In an exemplary embodiment, the variable capacitor in the phase compensation circuit includes at least one of: an adjustable capacitor and a source-drain shorted transistor.

In order to better understand the low-phase-shift variable-gain amplifier, hereinafter, the described technical solutions will be described in combination with optional embodiments, but the optional embodiments are not intended to limit the technical solutions of the embodiments of the present disclosure.

Optional embodiments of the present disclosure provide a low-phase-shift variable-gain amplifier to which a capacitance compensation technique is introduced, wherein the low-phase-shift variable-gain amplifier includes a single-stage differential cascode amplifier, current-steering, a phase compensation capacitor, an input impedance matching circuit and an output impedance matching circuit. By introducing an adjustable capacitor to compensate phase fluctuation caused by current-steering gain switching, a low additional phase shift is achieved, and the problem of large phase change of a traditional current-steering variable-gain amplifier is overcome. Moreover, the current-steering-based single-stage differential cascode structure has advantages of simple circuit structure design, small module layout area and low power consumption. Optional embodiments of the present disclosure can be used in microwave and millimeter wave communication and radar systems, and have the advantages of simple circuit structure, linear gain change, small additional phase change and low power consumption, etc.

It should be noted that, the low-phase-shift variable-gain amplifier may also be applied to the following scenarios: a radio frequency front-end chip of a 5G mobile phone, a phased array radar receiving front-end chip, a K-Ka-band base station receiving front-end chip or assembly, an automotive radar receiving front-end chip or assembly, and other radio frequency millimeter-wave front-end chips or assemblies, etc.

Figure 2:
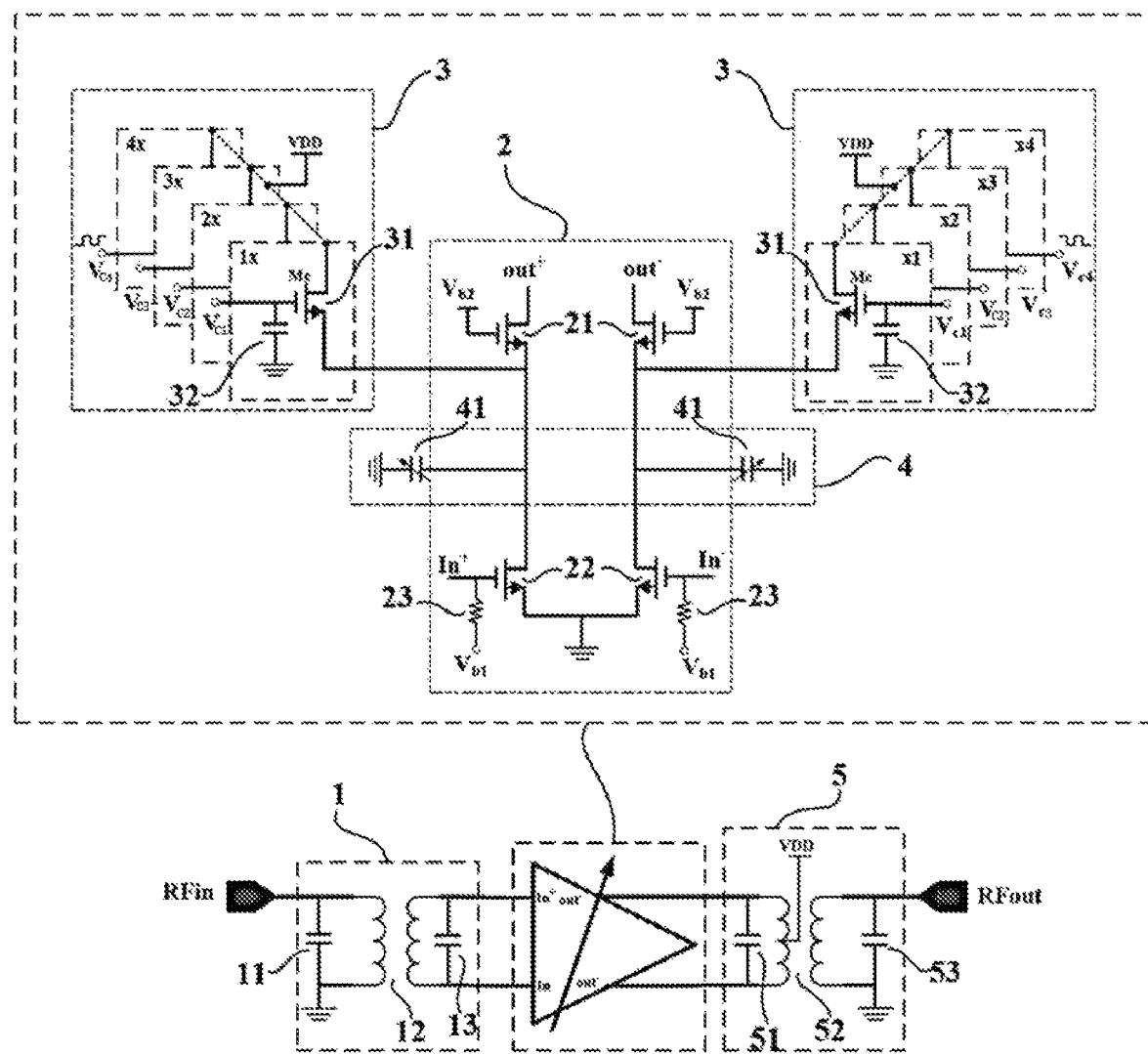
FIG. 2 is a circuit diagram of a low-additional-phase-shift variable-gain amplifier according to optional embodiments of the present disclosure.

As an optional embodiment, as shown in FIG. 2, in an optional embodiment of the present disclosure, the low-additional-phase-shift variable-gain amplifier includes an input-end impedance matching circuit 1 formed by a transformer, a differential cascode amplification circuit 2, current-steering structures 3 formed by a group of transistors of different sizes, a phase compensation capacitor 4, and an output-end impedance matching circuit 5 formed by a transformer.

The input-end impedance matching circuit 1 and the output-end impedance matching circuit 5 use transformer structures 12 and 52, a capacitor 11 and a capacitor 51 are respectively connected in parallel at input ends of the transformers 12 and 52, and a capacitor 13 and a capacitor 53 are respectively connected in parallel at output ends of the transformers to form a four-stage resonance circuit, to achieve broadband impedance matching.

Further, the differential cascode amplification circuit 2 is composed of a pair of differential common-source transistors 22 and a pair of differential common-gate transistors 21, which are connected in series, and has high output impedance and input/output shielding characteristics; two differential signals of the input-end impedance matching circuit 1 are respectively connected to gate stages of the common-source transistors 22 of the differential cascode amplification circuit, and serve as radio frequency signal inputs; and at the gate stage of each common-source transistor 22, a bias voltage is given by connecting a resistor 23 in parallel with the gate stage, so that the common-source transistor 22 is turned on and operates in a saturation state.

Further, each of the current-steering structures 3 consists of four groups of common-gate amplifiers 31 of different sizes, which form a gain attenuation control unit, to achieve gain attenuation of 7.5 dB, wherein the attenuation step is 0.5 dB; drains of the four groups of common-gate amplifiers are connected together, and are collectively connected to a VDD (Voltage Drain Drain, drain power supply voltage) power supply; and a digital control level is inputted into each gate stage of the four groups of common-gate amplifiers, and gain change is realized by controlling the turning on or turning off of the common-gate amplifiers 31 of different sizes, which is specifically implemented as: when the digital control level is a high level, the common-gate amplifier 31 is in a turning-on state, and when the digital control level is a low level, the common-gate amplifier is in a turning-off state; in addition, a filter capacitor 32 is added to prevent an alternating-current coupling signal from entering a bias circuit.

Further, each of the phase compensation capacitors 41 is a capacitance-adjustable capacitor, or the effect of variable capacitance can also be achieved by replacing the capacitance-adjustable capacitor with a drain-source shorted transistor. Phase change caused by gain change is compensated by matching different capacitance values for gain attenuation states.

It should be noted that, the input impedance matching circuit (1) and the output impedance matching circuit (5) use transformer structures (12, 52), capacitors (11, 51) are respectively connected in parallel at input ends of the transformers (12, 52), and capacitors (13, 53) are respectively connected in parallel at output ends of the transformers to form a four-stage resonance circuit, to achieve broadband impedance matching. The differential cascode amplification circuit (2) is composed of differential common-source transistors (22) and differential common-gate transistors (21), which are connected in series, and has high output impedance and input/output shielding characteristics; each of the current-steering structures (3) is constituted by a basic gain attenuation unit composed of four groups common-gate amplifiers (31) of different sizes, gain change is realized by digitally controlling the current-steering circuits to turn on or turn off the common-gate transistors (31) of different sizes, and in addition, a filter capacitor (32) is added to prevent an alternating-current coupling signal from entering the bias circuit; and each of the phase compensation capacitors (41) is a capacitance-adjustable capacitor, and an appropriate capacitance value is adjusted with regard to different gain attenuation states to compensate phase change caused by gain change.

Optionally, two differential signals of the input impedance matching circuit (1) are respectively connected to gate stages of the common-source transistors (22) of the differential cascode amplification circuit (2), and serve as radio frequency signal inputs.

Optionally, the differential cascode amplification circuit (2) is formed by connecting the common-source transistors (22) and the common-gate transistors (21) in series; and at the gate stage of each common-source transistor (22), a bias voltage is given by connecting a resistor (23) in parallel with the gate stage.

Optionally, the current-steering structure (3) uses four groups of transistors (31) with different width-to-length ratios to realize 7.5 dB gain attenuation, and the attenuation step is 0.5 dB. Optionally, the current-steering structure (3) adopts a structure of four groups, but not limited to four groups, of transistors (31).

Optionally, the phase compensation circuit (4) is connected in parallel at a node where the current-steering (3) is connected to the differential cascode amplifier (2), and phase compensation capacitors (41) of the phase compensation circuit achieve compensation of phase change caused by gain change by giving different voltages under different gain attenuation states to present different capacitance values.

Optionally, each of the phase compensation capacitors (41) is an adjustable capacitor or a source-drain shorted transistor.

Figure 3:
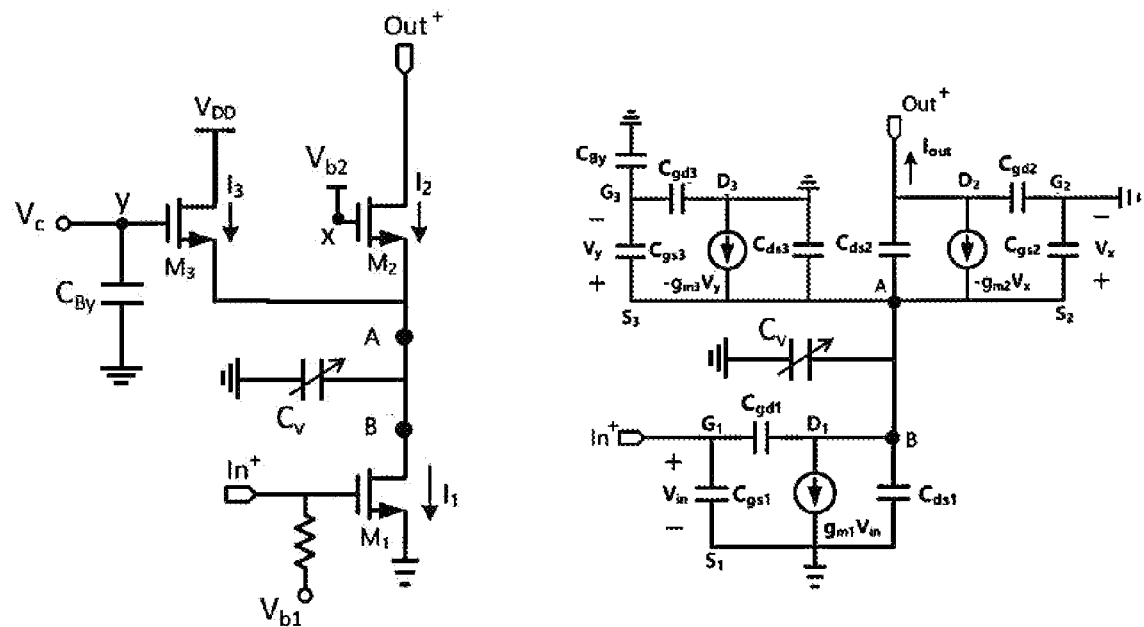
FIG. 3 is a schematic diagram of a small-signal equivalent circuit corresponding to a single-sided circuit of a cascode amplifier according to optional embodiments of the present disclosure.

As an optional embodiment, FIG. 3 is a schematic diagram of a small-signal equivalent circuit corresponding to a single-sided circuit of a cascode amplifier according to optional embodiments of the present disclosure.

As shown in FIG. 3, an optional operation principle of the present disclosure is analyzed by providing a single-sided circuit of the differential cascode amplification circuit and a small-signal model thereof. In order to clearly reflect frequency characteristics of the amplifier, gate-source capacitance Cgs, gate-drain capacitance Cgd and drain-source capacitance Cds of each of transistors M1, M2 and M3 are also taken into consideration. A radio frequency signal is inputted from a gate stage of the transistor M1, and by giving a bias voltage Vb1, a drain stage current flowing through the transistor M1 is I1; likewise, at a gate stage of the transistor M2, also by giving a bias voltage Vb2, a drain stage current flowing through the transistor M2 is I2. Vc is a control voltage for controlling the current-steering transistor M3, which is specifically implemented as: when Vc is at a high level, the transistor M3 is turned on, and when Vc is at a low level, the transistor M3 is turned off. When the transistor M3 is in a turning-on state, a drain stage current flowing through the transistor M3 is I3, and the value of the drain stage current I3 is closely related to the size of the transistor M3; therefore, different drain currents I3 can be obtained by turning on the transistor M3 of different sizes. Currents I1, I2 and I3 have the following relationship:

$$I2+I3 = I1.$$

When the transistor M3 is in a turning-off state, the current I2 is equal to I1, and at this time, the circuit gain is the maximum; and when the current-steering is in a turning-on state and the transistor M3 switches from a small size to a large size, the current I3 increases and the current I2 decreases, and therefore the circuit gain also decreases.

The currents I1, I2 and I3 can be represented by the following formulas:

$$I_1 = V_B \cdot (j\omega C_v + j\omega C_{ds1}) + g_{m1} \cdot V_{in} + (V_{in} - V_B) \cdot j\omega C_{gd1}.$$
$$I_2 = -V_A \cdot j\omega C_{gs2} - g_{m2} \cdot V_x - V_A \cdot j\omega C_{ds2}.$$
$$I_3 = -V_A \cdot j\omega C_{ds3} - g_{m3} \cdot V_y - V_A \cdot j\omega C_{ds3}.$$

$g_{m,1}$, $g_{m,2}$, and $g_{m3}$ denote transconductance of the transistors M1, M2 and M3; $C_v$ denotes the capacitance value of the variable capacitor; and $V_{in}$ denotes a gate voltage of the transistor M1, and $V_x$, $V_y$, $V_A$, $V_B$ denote voltages at nodes x, y, A, and B. $V_x$, $V_y$, $V_A$, $V_B$ have the following relationship:

$$V_x = V_y = V_A = V_B.$$

Therefore, according to the relationship of I1, I2 and I3, the following transfer function can be listed:

$$\frac{I_{out}}{V_{in}} = \frac{(j\omega C_{gd1} - g_{m1})(g_{m2} + j\omega C_{ds2})}{g_{m2} + g_{m3} + j\omega C_\zeta},$$

where $$C_\zeta = C_{gd1} + C_{ds1} + C_{gs2} + C_{ds2} + C_{ds3} + C_{gs3} + C_v.$$

Phase characteristics of the transfer function are as follows:

$$\angle \frac{I_{out}}{V_{in}} = -\tan^{-1}\left(\frac{\omega C_{gd1}}{g_{m1}}\right) + \tan^{-1}\left(\frac{\omega C_{ds2}}{g_{m2}}\right) - \tan^{-1}\left(\frac{\omega C_\zeta}{g_{m2}+g_{m3}}\right).$$

The phase characteristics thereof may be considered as accumulation of three parts, which are represented by $\theta_1$, $\theta_2$ and $\theta_3$ respectively. Phase fluctuation in two states of the maximum gain and the minimum gain of the variable-gain amplifier are represented as:

$$\Delta\theta = \Delta\theta_1 + \Delta\theta_2 + \Delta\theta_3.$$

$$\Delta\theta_1 = -\tan^{-1}\left(\frac{\omega C_{gd1}}{g_{m1,max}}\right) + \tan^{-1}\left(\frac{\omega C_{gd1}}{g_{m1,min}}\right) = 0.$$

$$\Delta\theta_2 = -\tan^{-1}\left(\frac{\omega C_{ds2}}{g_{m2,max}}\right) - \tan^{-1}\left(\frac{\omega C_{ds2}}{g_{m2,min}}\right) < 0.$$

$$\Delta\theta_3 = -\tan^{-1}\left(\frac{\omega C_{\zeta,max}}{g_{m2,max}+g_{m3,min}}\right) + \tan^{-1}\left(\frac{\omega C_{\zeta,min}}{g_{m2,min}+g_{m3,max}}\right) > 0.$$

The transconductance of the M1 transistor remains constant during gain change, so $\Delta\theta_1$ is equal to zero; along with increase of the size of the M3 transistor, the current I2 flowing through the M2 transistor decreases, which causes decrease of the transconductance $g_{m2}$ of the transistor M2, and thus $\Delta\theta_2$ is equal to zero; therefore, the adjustable capacitance $C_v$ needs to be changed under different gain states, so that the adjustable capacitance is at an appropriate value and satisfies $\Delta\theta_3$ greater than zero, thereby obtaining $\Delta\theta_2+\Delta\theta_3=0$, and achieving zero phase fluctuation of the variable-gain amplifier under the maximum gain and the minimum gain.

Figure 4:
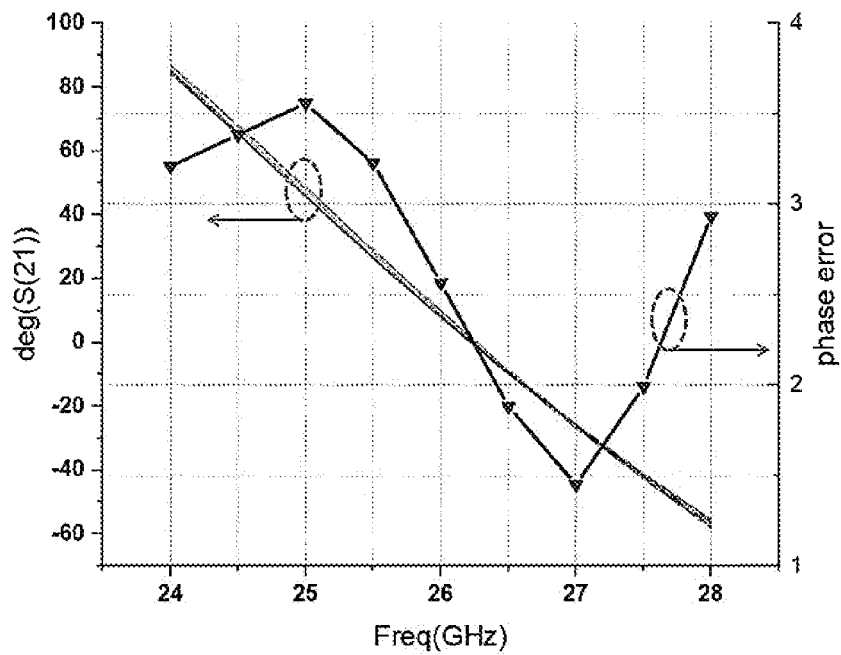
FIG. 4 is a schematic diagram of a phase curve and phase shift error at different gain states according to optional embodiments of the present disclosure.

Optionally, as shown in FIG. 4, it is a schematic diagram of a phase curve and phase shift error at different gain states according to optional embodiments of the present disclosure. In an optional embodiment of the present disclosure, the maximum phase shift error is smaller than 3.6 degrees in a range from 24 GHz to 28 GHz, which has the advantage of low additional phase shift.

Figure 5:
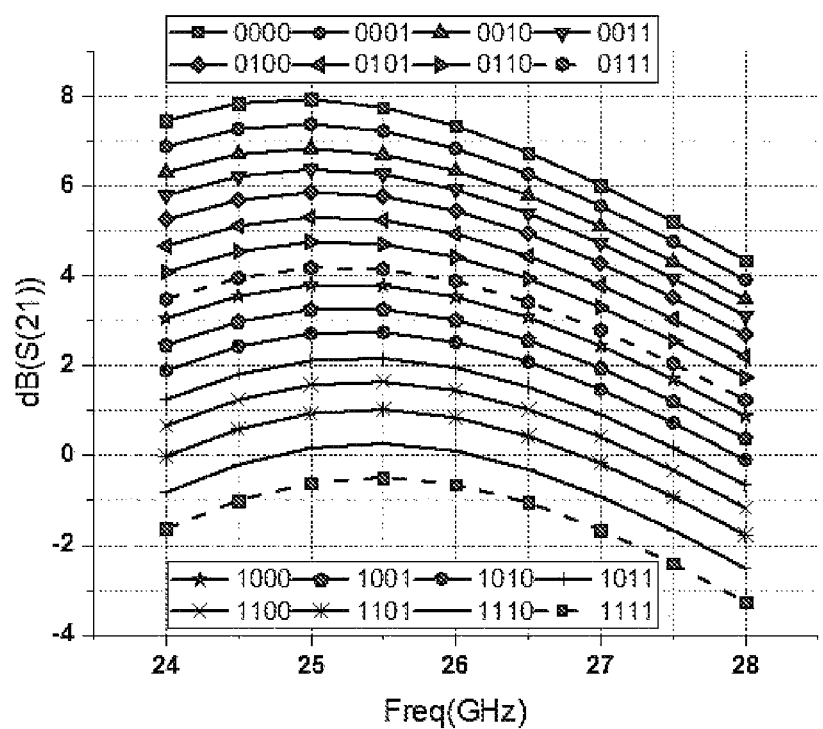
FIG. 5 is a schematic diagram of a gain curve under different states according to optional embodiments of the present disclosure.

Optionally, as shown in FIG. 5, it is a schematic diagram of a gain curve under different states according to optional embodiments of the present disclosure. In an optional embodiment of the present disclosure, gain attenuation curves controlled by digital logic from 0000 to 1111 in a range of 24 GHz to 28 GHz are shown, in which a total gain change amount of 7.5 dB and an attenuation step bit of 0.5 dB are achieved by 4-bit control bits.

By the described technical solutions, optional embodiments of the present disclosure provide a variable-gain amplification circuit to which an adjustable capacitor is introduced as the phase compensation circuit, phase shift fluctuation of the amplification circuit during switching between different gain states is significantly reduced; moreover, the current-steering-based single-stage differential cascode structure in the present disclosure has advantages of simple circuit structure design, small module layout area and low power consumption.

Figure 6:
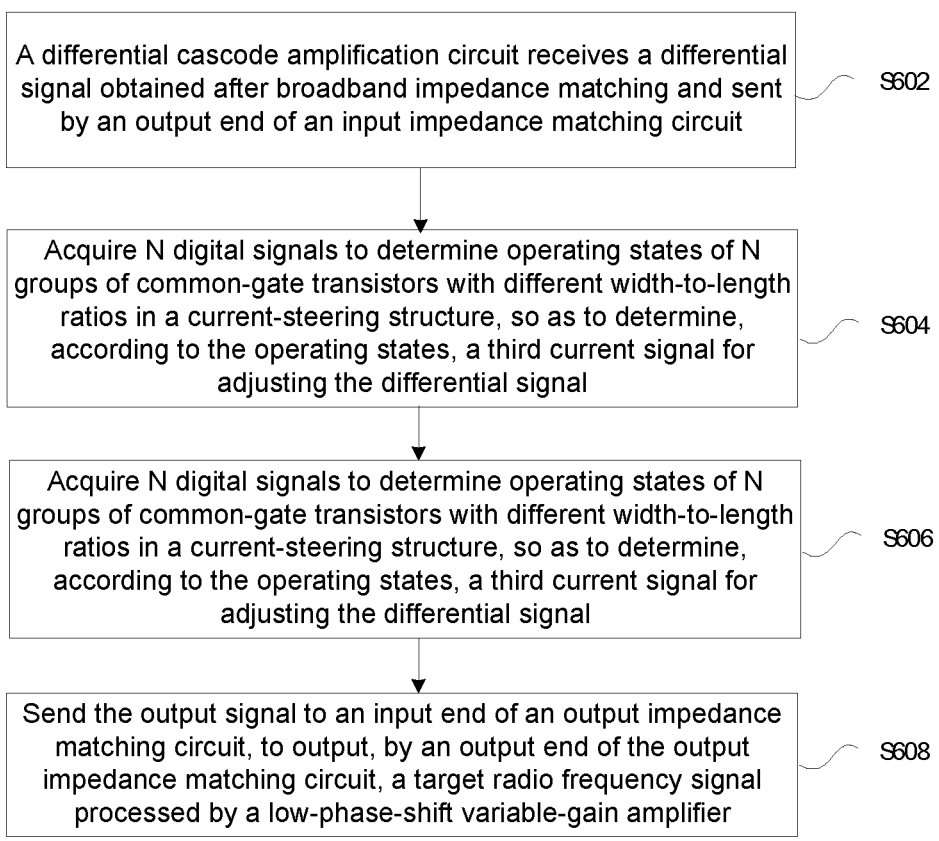
FIG. 6 is a flowchart of a method for processing a radio frequency signal according to embodiments of the present disclosure.

The present embodiment further provides a method for processing a radio frequency signal. FIG. 6 is a flowchart of the method for processing a radio frequency signal according to embodiments of the present disclosure. As shown in FIG. 6, the method includes the following steps:

step S602, a differential cascode amplification circuit receives a differential signal obtained after broadband impedance matching and sent by an output end of an input impedance matching circuit;

step S604, N digital signals are acquired to determine operating states of N groups of common-gate transistors with different width-to-length ratios in a current-steering structure, so as to determine, according to the operating states, a third current signal for adjusting the differential signal;

step S606, gain is performed on the differential signal according to the third current signal, to obtain an output signal; and step S608, the output signal is sent to an input end of an output impedance matching circuit, to output, by an output end of the output impedance matching circuit, a target radio frequency signal processed by a low-phase-shift variable-gain amplifier.

By the present disclosure, provided are a differential cascode amplification circuit, the differential cascode amplification circuit comprising a common-source transistor and a common-gate transistor, wherein a gate stage of the common-source transistor is connected to a first bias voltage by a target resistor, the first bias voltage is used to control a drain current signal outputted by the common-source transistor to be a first current signal with a fixed amplitude, and a gate stage of the common-gate transistor is connected to a second bias voltage, the second bias voltage is used to control a drain current signal outputted by the common-gate transistor to be a second current signal with a variable amplitude, and the amplitude of the first current signal is greater than or equal to the amplitude of the second current signal; a current-steering structure, wherein one end of the current-steering structure is connected between the common-source transistor and the common-gate transistor, a third current signal outputted by the current-steering structure is used to adjust a gain of the differential cascode amplification circuit, and the gain represents a gain of an output signal of the differential cascode amplification circuit relative to an input signal; and a phase compensation circuit, wherein one end of the phase compensation circuit is connected between the common-source transistor and the common-gate transistor, and a compensation capacitance value of a variable capacitor in the phase compensation circuit is a capacitance value determined according to the third current signal, wherein the variable capacitor is configured to reduce generated phase shift of the second current signal when the third current signal adjusts the gain of the differential cascode amplification circuit. That is to say, an adjustable capacitor is introduced into the variable-gain amplification circuit as the phase compensation circuit, phase shift fluctuation of the amplification circuit during switching between different gain states is significantly reduced, and the problem of large phase change of a traditional current-steering variable-gain amplifier is overcome; furthermore, the differential cascode structure has advantages of simple circuit structure design, small module layout area and low power consumption, which reduces the occurrence of additional increase of design work of inter-stage impedance matching, and increase of layout size and excessive power consumption. The described technical solutions are used to solve the problems in the related art that phase change brought about by gain change of the variable-gain amplifier cannot be effectively reduced, etc.

In an exemplary embodiment, after N digital signals are acquired to determine operating states of N groups of common-gate transistors with different width-to-length ratios in a current-steering structure, so as to determine, according to the operating states, a third current signal for adjusting the differential signal, the method further includes: a target capacitance value to be compensated by a phase compensation circuit is determined according to the magnitude of the third current signal; and the target capacitance value is used to perform phase compensation on the differential cascode amplification circuit, so as to reduce generated phase shift of a second current signal.

For specific examples in the present embodiment, reference can be made to the examples described in the described embodiments and exemplary embodiments, and thus they will not be repeated again in the present embodiment.

In the illustration of the present disclosure, it should be understood that orientation or positional relationships indicated by terms such as "center", "upper", "lower", "front", "rear", "left", "right", etc. are orientation or positional relationships based on those as shown in the accompanying drawings, are only used to facilitate the illustration of the present disclosure and to simplify the illustration, rather than indicating or implying that an apparatus or assembly referred to must have a specific orientation, and be constructed and operated in the specific orientation, and therefore said terms cannot be understood as limitation to the present disclosure. In addition, the terms "first", "second" and the like are used for descriptive purposes only and cannot be construed as indicating or implying relative importance.

In the illustration of the present disclosure, it should be noted that unless specified and limited otherwise, the terms "mount", "connect", and "connect to" should be understood broadly, and for example, may be fixed connection, and may also be detachable connection, or integral connection; may be mechanical connection, and may also be electrical connection; and may be direct connection, and may also be indirect connection by means of an intermediate medium, and may also be interior communication between two assemblies. When an assembly is referred to as being "fixed to" or "provided on" another element, the assembly may be directly on the other assembly or an intermediate assembly may also exist. When an assembly is considered as being "connected" to another element, the assembly may be directly connected to the other element or an intermediate element may exist at the same time. For a person of ordinary skill in the art, the specific meanings of the described terms in the present disclosure could be understood according to specific situations.

It is apparent that a person skilled in the art shall understand that all of the described modules or steps in the present disclosure may be implemented by using a general computing apparatus, may be centralized on a single computing apparatus or may be distributed on a network composed of multiple computing apparatuses, and may be implemented by using executable program codes of the computing apparatus. Thus, the program codes may be stored in a storage apparatus and executed by the computing apparatus, and in some cases, the shown or described steps may be executed in a sequence different from that shown herein, or the modules or steps are manufactured into integrated circuit modules, or multiple modules or steps therein are manufactured into a single integrated circuit module for implementation. Thus, the present disclosure is not limited to any specific hardware and software combinations.

The content above merely relates to preferred embodiments of the present disclosure, and is not intended to limit the present disclosure. For a person skilled in the art, the present disclosure may have various modifications and changes. Any modifications, equivalent replacements, improvements, etc. made within the principle of the present disclosure shall all fall within the scope of protection of the present disclosure.

What is claimed is:

1. A low-phase-shift variable-gain amplifier, comprising:
   a differential cascode amplification circuit, which comprises a common-source transistor and a common-gate transistor, wherein a gate stage of the common-source transistor is connected to a first bias voltage via a target resistor, the first bias voltage is used to control a drain current signal outputted by the common-source transistor to be a first current signal with a fixed amplitude, and a gate stage of the common-gate transistor is connected to a second bias voltage, the second bias voltage is used to control a drain current signal outputted by the common-gate transistor to be a second current signal with a variable amplitude, and the fixed amplitude of the first current signal is greater than or equal to the variable amplitude of the second current signal;
   a current-steering structure, wherein one end of the current-steering structure is connected between a drain of the common-source transistor and a source of the common-gate transistor, a third current signal outputted by the current-steering structure is used to adjust a gain of the differential cascode amplification circuit, and the gain of the differential cascode amplification circuit represents a gain of an output signal of the differential cascode amplification circuit relative to an input signal; and
   a phase compensation circuit, wherein one end of the phase compensation circuit is connected between a drain of the common-source transistor and a source of the common-gate transistor, and a compensation capacitance value of a variable capacitor in the phase compensation circuit is a capacitance value determined according to the third current signal, and wherein the variable capacitor is configured to reduce generated phase shift of the second current signal when the third current signal adjusts the gain of the differential cascode amplification circuit.

2. The low-phase-shift variable-gain amplifier according to claim 1, wherein the phase compensation circuit acquires the third current signal outputted by the current-steering structure; the capacitance value of the variable capacitor in the phase compensation circuit is increased when the third current signal increases; and the capacitance value of the variable capacitor in the phase compensation circuit is decreased when the third current signal decreases.

3. The low-phase-shift variable-gain amplifier according to claim 1, wherein the gate stage of the common-source transistor in the differential cascode amplification circuit is connected to an output end of an input impedance matching circuit, and is configured to receive an input signal obtained after bandwidth impedance matching is performed by the input impedance matching circuit, and wherein the bandwidth impedance matching is used to instruct to convert a single-ended signal of a radio frequency signal into a differential signal.

4. The low-phase-shift variable-gain amplifier according to claim 3, wherein a drain stage of the common-gate transistor in the differential cascode amplification circuit is connected to an input end of an output impedance matching circuit, and is configured to output, by the output impedance matching circuit, an output signal obtained after processing by the differential cascode amplification circuit.

5. The low-phase-shift variable-gain amplifier according to claim 4, wherein the input impedance matching circuit and the output impedance matching circuit use a four-stage resonance circuit in which capacitors are connected in parallel in transformer structures.

6. The low-phase-shift variable-gain amplifier according to claim 1, wherein the current-steering structure comprises N groups of common-gate transistors with different width-to-length ratios, and is configured to determine the outputted third current according to operating states of the common-gate transistors with the different width-to-length ratios, wherein N is a positive integer greater than or equal to 4, and the width-to-length ratio is used to indicate a ratio of a gate width to a gate length of a corresponding gate stage of the common-gate transistors forming the current-steering structure.

7. The low-phase-shift variable-gain amplifier according to claim 6, wherein drains of the N groups of common-gate transistors with different width-to-length ratios are connected in series and connected to a target voltage.

8. The low-phase-shift variable-gain amplifier according to claim 6, wherein a gate of each common-gate transistor among the N groups of common-gate transistors with different width-to-length ratios corresponds to one digital signal, wherein the digital signal is used to indicate an operating state of each common-gate transistor among the N groups of common-gate transistors with different width-to-length ratios in the current-steering structure at the same time point.

9. The low-phase-shift variable-gain amplifier according to claim 6, wherein when the value of N is 4, change range of gain attenuation of the differential cascode amplification circuit correspondingly controlled by the current-steering structure is 0 dB-7.5 dB, wherein attenuation step of the gain attenuation is 0.5 dB.

10. The low-phase-shift variable-gain amplifier according to claim 7, wherein the variable capacitor in the phase compensation circuit comprises at least one of: an adjustable capacitor and a source-drain shorted transistor.

11. A method for processing a radio frequency signal, applied to the low-phase-shift variable-gain amplifier according to claim 1, the method comprising:
receiving, by the differential cascode amplification circuit, a differential signal obtained after broadband impedance matching and sent by an output end of an input impedance matching circuit;
acquiring N digital signals, to determine operating states of N groups of common-gate transistors with different width-to-length ratios in the current-steering structure, so as to determine, according to the operating states, the third current signal for adjusting the differential signal, wherein N is a positive integer;
performing gain on the differential signal according to the third current signal, to obtain an output signal; and
sending the output signal to an input end of an output impedance matching circuit, to output, by an output end of the output impedance matching circuit, a target radio frequency signal processed by the low-phase-shift variable-gain amplifier.

12. The method for processing a radio frequency signal according to claim 11, wherein after acquiring the N digital signals to determine operating states of the N groups of common-gate transistors with different width-to-length ratios in the current-steering structure, so as to determine, according to the operating states, the third current signal for adjusting the differential signal, the method further comprises:

determining, according to a magnitude of the third current signal, a target capacitance value to be compensated by the phase compensation circuit; and
performing phase compensation on the differential cascode amplification circuit by using the target capacitance value, so as to reduce generated phase shift of the second current signal.

13. The method for processing a radio frequency signal according to claim 11, wherein the phase compensation circuit acquires the third current signal outputted by the current-steering structure; the capacitance value of the variable capacitor in the phase compensation circuit is increased when the third current signal increases; and the capacitance value of the variable capacitor in the phase compensation circuit is decreased when the third current signal decreases.

14. The method for processing a radio frequency signal according to claim 11, wherein the gate stage of the common-source transistor in the differential cascode amplification circuit is connected to an output end of an input impedance matching circuit, and is configured to receive an input signal obtained after bandwidth impedance matching is performed by the input impedance matching circuit, and wherein the bandwidth impedance matching is used to instruct to convert a single-ended signal of the radio frequency signal into the differential signal.

15. The method for processing a radio frequency signal according to claim 14, wherein a drain stage of the common-gate transistor in the differential cascode amplification circuit is connected to an input end of an output impedance matching circuit, and is configured to output, by the output impedance matching circuit, an output signal obtained after processing by the differential cascode amplification circuit.

16. The method for processing a radio frequency signal according to claim 15, wherein the input impedance matching circuit and the output impedance matching circuit use a four-stage resonance circuit in which capacitors are connected in parallel in transformer structures.

17. The method for processing a radio frequency signal according to claim 11, wherein the current-steering structure comprises the N groups of common-gate transistors with different width-to-length ratios, and is configured to determine the outputted third current according to operating states of the common-gate transistors with different width-to-length ratios, wherein N is a positive integer greater than or equal to 4, and the width-to-length ratio is used to indicate a ratio of a gate width to a gate length of a corresponding gate stage of the common-gate transistors forming the current-steering structure.

18. The method for processing a radio frequency signal according to claim 17, wherein drains of the N groups of common-gate transistors with different width-to-length ratios are connected in series and connected to a target voltage.

19. The method for processing a radio frequency signal according to claim 17, wherein a gate of each common-gate transistor among the N groups of common-gate transistors with different width-to-length ratios corresponds to one digital signal, and wherein the digital signal is used to indicate an operating state of each common-gate transistor among the N groups of common-gate transistors with different width-to-length ratios in the current-steering structure at the same time point.

20. The method for processing a radio frequency signal according to claim 17, wherein when the value of N is 4, change range of gain attenuation of the differential cascode amplification circuit correspondingly controlled by the current-steering structure is 0 dB-7.5 dB, wherein attenuation step of the gain attenuation is 0.5 dB.

* * * * *